US007042143B2

(12) United States Patent
Bindig et al.

(10) Patent No.: US 7,042,143 B2
(45) Date of Patent: May 9, 2006

(54) PIEZOCERAMIC MULTILAYER ACTUATOR WITH A TRANSITION REGION BETWEEN THE ACTIVE REGION AND THE INACTIVE HEAD AND FOOT REGIONS

(75) Inventors: Reiner Bindig, Bindlach (DE); Jürgen Schmidt, Marktredwitz (DE); Matthias Simmerl, Herrfenfeld (DE); Günter Helke, Lauf (DE); Hans-Jürgen Schreiner, Neunkirchen am Sand-Rollhofen (DE)

(73) Assignee: CeramTec Ag Innovative Ceramic Engineering, Plochingen (DE)

( * ) Notice: Subject to any disclaimer, the term of this patent is extended or adjusted under 35 U.S.C. 154(b) by 534 days.

(21) Appl. No.: 10/075,558

(22) Filed: Feb. 13, 2002

(65) Prior Publication Data

US 2003/0001463 A1   Jan. 2, 2003

(30) Foreign Application Priority Data

Feb. 15, 2001 (DE) ............................. 101 07 504
Jan. 24, 2002 (DE) ............................. 102 02 574

(51) Int. Cl.
*H01L 41/083* (2006.01)

(52) U.S. Cl. ...................... 310/366; 310/328
(58) Field of Classification Search ............. 310/328, 310/366
See application file for complete search history.

(56) References Cited

U.S. PATENT DOCUMENTS

| 5,168,189 A | * | 12/1992 | Dam et al. ............ 310/328 |
| 5,218,259 A | * | 6/1993 | Dam et al. ............ 310/328 |
| 5,271,133 A | * | 12/1993 | Dam et al. ............ 29/25.35 |
| 5,295,288 A | * | 3/1994 | Dam et al. ............ 29/25.35 |
| 5,892,416 A | * | 4/1999 | Unami et al. .......... 333/187 |
| 6,291,929 B1 | | 9/2001 | Heinz et al. |
| 2001/0047796 A1 | * | 12/2001 | Yamada et al. ........ 123/498 |
| 2002/0084872 A1 | * | 7/2002 | Kawazoe ............... 333/186 |
| 2002/0185935 A1 | * | 12/2002 | Yamamoto et al. ..... 310/328 |

FOREIGN PATENT DOCUMENTS

WO    WO 92/06511    *    4/1992

* cited by examiner

*Primary Examiner*—Thomas M. Dougherty
(74) *Attorney, Agent, or Firm*—Fulbright & Jaworski L.L.P.

(57) ABSTRACT

In piezoceramic multilayer actuators, the head region and the foot region consist of inactive, that is to say electrode-free, piezoceramic layers. Due to the arrangement of the metallic electrodes and the layers of the piezoceramic materials, the shrinkage of the piezoceramic material, in particular in the passive head region and foot region, is influenced during the sintering process and can cause the formation of cracks. Different expansion behavior of the active and of the passive region during operation also lead to stresses which favor crack formation, in particular at the boundary between both regions.

Figure 1:
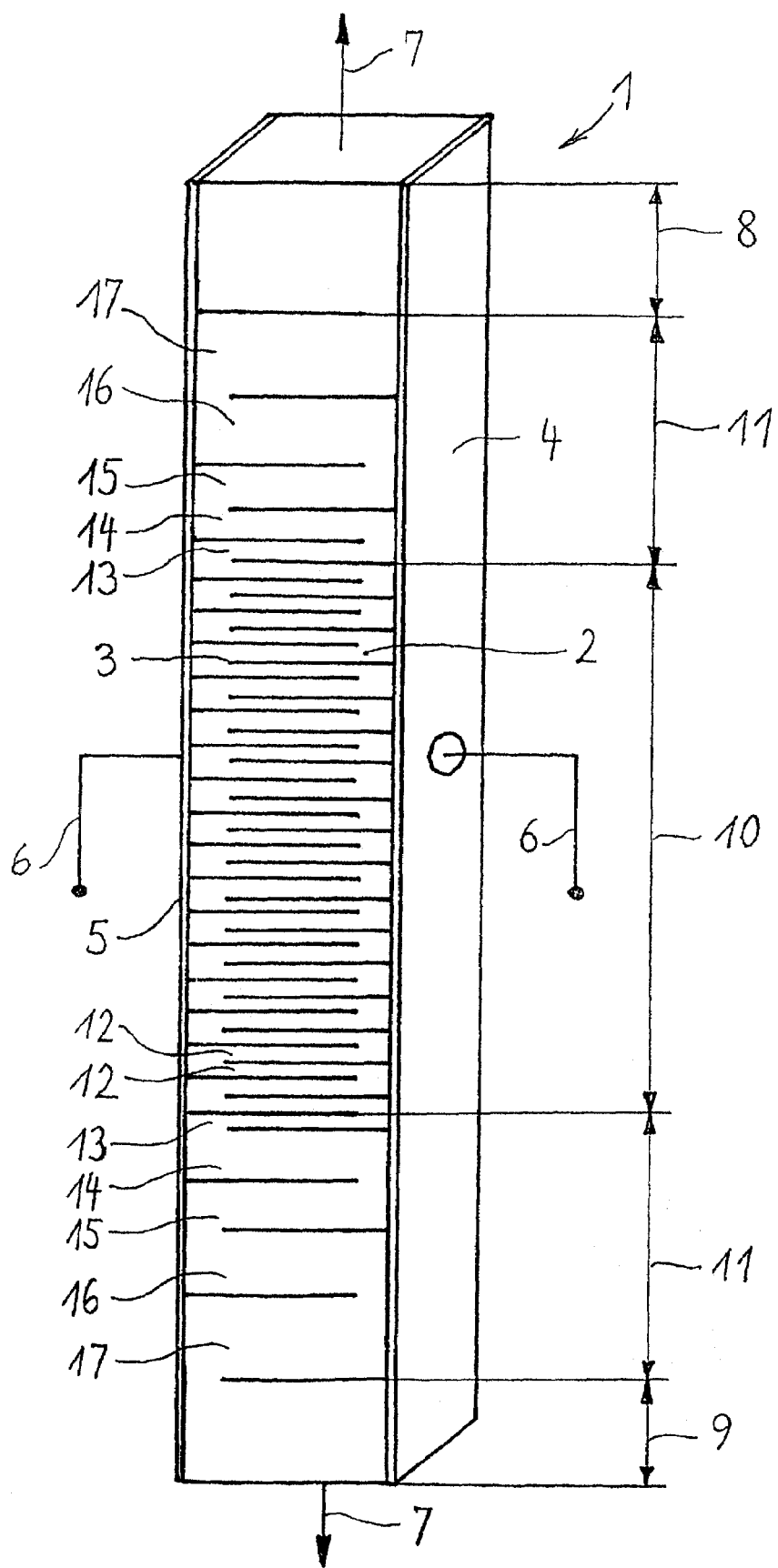

According to the invention, it is therefore proposed that a transition region (11), whose shrinkage and expansion behavior lies between the shrinkage and expansion behavior of the active region (10) and the shrinkage and expansion behavior of an inactive region (8, 9) which are electrode free, adjoins the active region (10) up to the inactive head region (8) and up to the inactive foot region (9).

6 Claims, 2 Drawing Sheets

PIEZOCERAMIC MULTILAYER ACTUATOR WITH A TRANSITION REGION BETWEEN THE ACTIVE REGION AND THE INACTIVE HEAD AND FOOT REGIONS

The invention concerns a piezoceramic multilayer actuator according to the preamble of the first claim.

Multilayer actuators made from piezoceramic materials have two-way contacting, that is to say the internal electrodes are led out alternately at the surface of the opposite sides of the actuator and each is electrically connected in parallel at that point through an external electrode. For electrical isolation, the head region and the foot region consist of inactive, that is to say electrode free layers of piezoceramic.

The shrinkage of the piezoceramic material, in particular in the passive head and foot regions, is influenced by the sintering process due to the arrangement of the metallic electrodes and the layers of piezoceramic material. Differences in shrinkage between regions located close to electrodes and regions located away from electrodes lead to stresses in the ceramic material, which either cause cracks during the sintering process or act to reduce the strength of the finished component. As a result, the susceptibility of these components to the formation of cracks during operation is considerably increased. Different expansion characteristics of the active and of the passive region during operation lead to stresses which favour crack formation, in particular at the boundary between the two regions. Cracks can be tolerated in a few applications. However, there are fundamental problems. If the actuator is not completely encapsulated, electric fields occur at the ends of the electrodes exposed by the cracks, which can lead to the adsorption of water or other polar molecules. These cause leakage currents or lead to a serious degradation of the actuator performance. Also, it cannot be totally ruled out that the actuators fail during operation because of cavitation due to earlier crack damage.

The object of the invention is to eliminate to a large degree the occurrence of crack-forming stresses.

This object is achieved by means of the characterising features of the first claim. Other advantageous developments of the invention are claimed in the sub-claims.

According to the invention, a transition region, whose shrinkage behaviour during manufacture and whose expansion behaviour during operation lies between the respective shrinkage or behaviour of the active region and the respective shrinkage or expansion behaviour of the piezoelectrically inactive regions, is interposed between the active region and the inactive head and foot regions. This transition region can be created by two measures. The spacing between the inner electrodes and the actuator ends can either be increased from electrode to electrode in the transition region, or the material of the transition region may consist of a piezoceramic material whose shrinkage and expansion behaviour lies between the properties of the active region and the properties of the passive region. The properties of the material in the transition region, in particular its sinter characteristic, can be influenced by doping with impurity atoms. The materials of the inner electrodes are suitable for this purpose. The doping can be a concentration produced by natural diffusion in the active region at the boundary between an inner electrode and the ceramic material. Doping can be carried out with silver, for example, which is a material of the inner electrodes.

According to the invention, increasing the spacings of the inner electrodes in the transition region has the effect that during fabrication of a multilayer actuator, the different shrinkages between the active and the inactive regions do not occur abruptly and thus crack formation due to the build-up of stresses is avoided. When the operating voltage is applied during the operation of the actuator, the field strength in the transition region is gradually reduced to zero in accordance with the increase in the electrode spacing. The stresses which would otherwise be produced by the differential expansion of the active region and the adjacent inactive region are distributed through the transition region within a much greater component volume. This prevents the stresses reaching a critical magnitude which triggers crack formation. The increase in the spacings between the electrodes in the intermediate region can be produced by stacking a suitable number of films of piezoceramic material between the electrodes at the desired spacing, these films not being printed with electrodes.

There are different ways of increasing the inner electrode-to-inner electrode spacing in the transition region. The spacing can be increased stepwise by the natural scale progression. If, for example, the electrode spacing in the active region is 100 µm, which generally corresponds to the thickness of a layer of piezoceramic material together with the metallic material layer of the electrode, then the spacing in the transition region is increased in steps of 200 µm, 300 µm, 400 µm, etc.

In a further development of the invention the electrode-to-electrode spacing can also be increased stepwise in the transition region in a geometric progression. Likewise, starting with a spacing of the inner electrodes of 100 µm, in this case the spacing increases in steps of 200 µm, 400 µm, 800 µm, etc.

In the transition region, the spacing of the inner electrodes can also be effected stepwise in a logarithmic scale.

Figure 2:
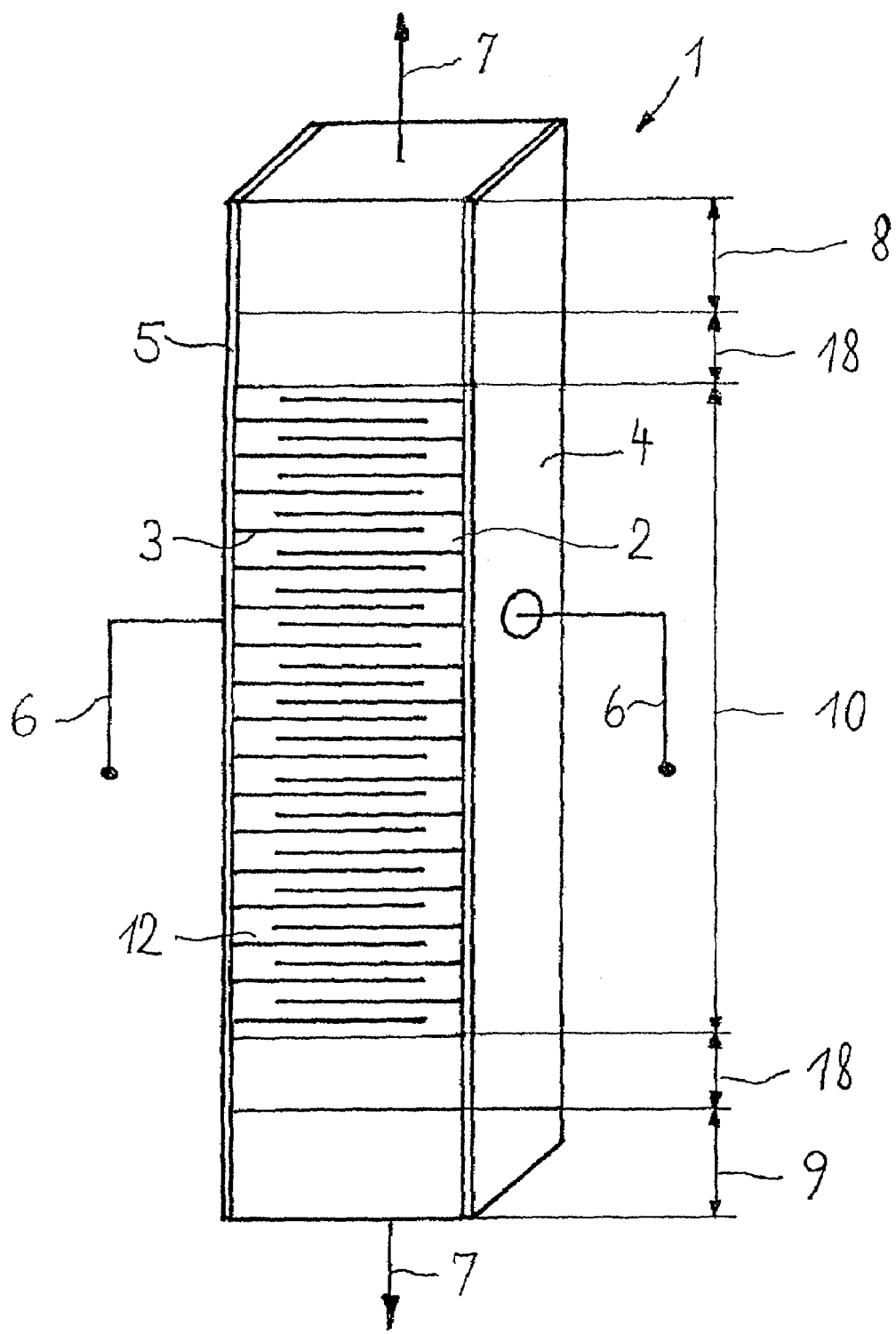

The invention is explained in further detail with the aid of exemplifying embodiments, wherein:

FIG. 1 shows a multilayer actuator according to the invention, whose transition region is formed by increasing the spacing between the electrodes, and FIG. 2 shows a multilayer actuator according to the invention, whose transition region is formed by a piezoceramic material whose shrinkage and expansion behaviour lies between the properties of the active region and of the passive region.

A piezoceramic multilayer actuator 1 is shown schematically in a much enlarged form in FIG. 1. The actuator has an alternating contact arrangement. It has been fabricated in a monolithic process, that is to say it consists of stacked thin layers 2 of piezoelectrically active material, for example lead zirconate titanate (PZT), with conductive inner electrodes 3 disposed between said layers. Prior to sintering, the inner electrodes 3 are printed by a silk-screen process onto the piezoelectrically active layers 2, the so-called green films. The films 2 are pressed along with the inner electrodes 3 into a stack, pyrolized and then sintered, thereby producing a monolithic multilayer actuator 1.

The inner electrodes 3 are led out alternately to the opposite surfaces of the actuator, where they are interconnected by an outer electrode 4, 5. As a result, each of the inner electrodes 3 is electrically connected in parallel at one side of the actuator 1 and thus combined in one group. The outer electrodes 4, 5 are the connecting poles of the actuator. If an electrical voltage is applied via the connections 6 to the connecting poles, then this electric voltage is transmitted in parallel to all inner electrodes 3 and produces an electric field in all layers 2 of the active material, which is consequently mechanically deformed. The sum of all these mechanical deformations is available at the end faces of the actuator 1 as a useable expansion 7 and/or force.

A conventional multilayer actuator consists of the inactive head region 8 and the inactive foot region 9, in which no inner electrodes are disposed, and the active region 10 with the inner electrodes 3. In the multilayer actuator 1 according to the invention, a transition region 11 is disposed between the electrode-free head region 8 and the electrode-free foot region 9 and the active region 10, respectively. Whereas the spacing 12 of the inner electrodes 3 in the active region 10 is always identical, it increases from electrode to electrode within the transition regions 11 up to the head region 8 and the foot region 9, respectively. In the present exemplifying embodiment, starting with the spacing 12 of the inner electrodes 3 in the active region 10, the spacings increase stepwise in a natural scale progression. The spacing 13 still corresponds to the spacing 12 in the active region 10 and with it the thickness of one foil or layer 2 of piezoelectrically active material in the sintered electrode to electrode within the transition regions 11 up to the head region 8 and the foot region 9, respectively. In the present exemplifying embodiment, starting with the spacing 12 of the inner electrodes 3 in the active region 10, the spacings increase stepwise in a natural scale progression. The spacing 13 still corresponds to the spacing 12 in the active region 10 and with it the thickness of one foil or layer 2 of piezoelectrically active material in the sintered state. The spacing 14 is twice that of the spacing 13 or the spacing 12, the spacing 15 is three times, the spacing 16 is four times and the spacing 17 is five times greater than the spacing 13. The increased spacing can be achieved by stacking a suitable number of layers 2 corresponding to the increased spacing.

The exemplifying embodiment of FIG. 2 differs from the exemplifying embodiment of FIG. 1 only in the transition region, which here is denoted by 18. Features corresponding to the previous exemplifying embodiment are denoted by the same reference numbers. The transition region 18 consists of a piezoceramic material whose shrinkage and expansion behaviour lies between the properties of the active region and the properties of the passive region. It is, for example, doped with silver, a material of the inner electrodes, in a concentration that is produced by natural diffusion in the active region at the boundary between an inner electrode and the ceramic material.

The invention claimed is:

1. A piezoceramic multilayer actuator comprising an active region, said active region further comprising inner electrodes led out alternately at a surface of said actuator, wherein, for parallel connection, said inner electrodes of identical polarity of said active region are connected to respective outer electrodes, said outer electrodes being disposed on opposite sides of said actuator; electrode-free piezoelectrically inactive regions further comprising a head region and a foot region; and a transitional region having shrinkage and expansion properties lying between the shrinkage and the expansion properties of said active and inactive regions, said transitional regions interposed between said active region and said respective inactive head and foot regions, wherein in said transitional regions, the electrode-to-electrode spacing between the inner electrodes increases in proximity to said inactive regions and wherein said increase in the spacing of said inner electrodes in said transitional region through said head region or the foot region starts from the spacing of said inner electrodes in said active region and is effected stepwise according to a logarithmic scale.

2. A piezoceramic multilayer actuator comprising an active region, said active region further comprising inner electrodes led out alternately at a surface of said actuator, wherein, for parallel connection, said inner electrodes of identical polarity of said active region are connected to respective outer electrodes, said outer electrodes being disposed on opposite sides of said actuator; electrode-free piezoelectrically inactive regions further comprising a head region and a foot region; and a transitional region having shrinkage and expansion properties lying between the shrinkage and the expansion properties of said active and inactive regions, said transitional regions interposed between said active region and said respective inactive head and foot regions, wherein said respective transitional regions consist of modified piezoceramic material, the shrinkage and expansion properties of said material lying within the shrinkage and the expansion properties of said active region.

3. The piezoceramic multilayer actuator of claim 2, wherein said properties can be influenced by doping said material with impurity atoms of the materials of the inner electrodes.

4. The piezoceramic multilayer actuator of claim 3, wherein the sintering properties of the material in the transitional region can be influenced by doping said material with impurity atoms of the materials of the inner electrodes.

5. The piezoceramic multilayer actuator of claim 4, wherein said doping exists in a concentration that is produced by natural diffusion in the active region at the boundary between an inner electrode and a ceramic material.

6. The piezoceramic multilayer actuator of claim 3, wherein said doping is effected with silver.

\* \* \* \* \*